United States Patent
Thimm et al.

(10) Patent No.: US 11,631,636 B2
(45) Date of Patent: Apr. 18, 2023

(54) MODULE WITH CONNECTION LUGS FOR SUPPLY LINES

(71) Applicant: CeramTec GmbH, Plochingen (DE)

(72) Inventors: Alfred Thimm, Wunsiedel (DE); Harald Kress, Langenzenn (DE)

(73) Assignee: CERAMTEC GMBH, Plochingen (DE)

( * ) Notice: Subject to any disclaimer, the term of this patent is extended or adjusted under 35 U.S.C. 154(b) by 0 days.

(21) Appl. No.: 17/340,707

(22) Filed: Jun. 7, 2021

(65) Prior Publication Data

US 2021/0384115 A1    Dec. 9, 2021

(30) Foreign Application Priority Data

Jun. 8, 2020  (EP) .................................... 20178790

(51) Int. Cl.
*H01L 23/498* (2006.01)
*H01L 21/48* (2006.01)
(Continued)

(52) U.S. Cl.
CPC .... *H01L 23/49838* (2013.01); *H01L 21/4867* (2013.01); *H01L 23/15* (2013.01);
(Continued)

(58) Field of Classification Search
CPC ............... H05K 7/20239; H05K 7/205; H05K 7/2089–209; H05K 2201/06–068;
(Continued)

(56) References Cited

U.S. PATENT DOCUMENTS

| 6,215,185 B1* | 4/2001 | Kikuchi | ............ H01L 23/49579 |
| | | | 257/734 |
| 2002/0008312 A1* | 1/2002 | Sasaki | ............... H01L 23/49861 |
| | | | 257/692 |

(Continued)

FOREIGN PATENT DOCUMENTS

| DE | 19752408 A1 | 6/1998 |
| EP | 0828341 A2 | 3/1998 |

(Continued)

OTHER PUBLICATIONS

European Search Report for EP 20178790.0, dated Nov. 19, 2020.

*Primary Examiner* — Zachary Pape
*Assistant Examiner* — Amir A Jalali
(74) *Attorney, Agent, or Firm* — Fitch Even Tabin & Flannery, LLP

(57) ABSTRACT

The invention relates to a module (1) in which voltages greater than 1,000 V and currents greater than 100 A are applied via supply lines, with an electrically insulating carrier (2), with a connection means (3) which has a material thickness greater than 0.3 mm and is connected to the carrier (2) via a metallization area (4) which is delimited by a first end (23) and a second end (24), with electronic components (19, 20) which are connected to the connection means (3) as required, and with cooling means (14).

Figure 1:
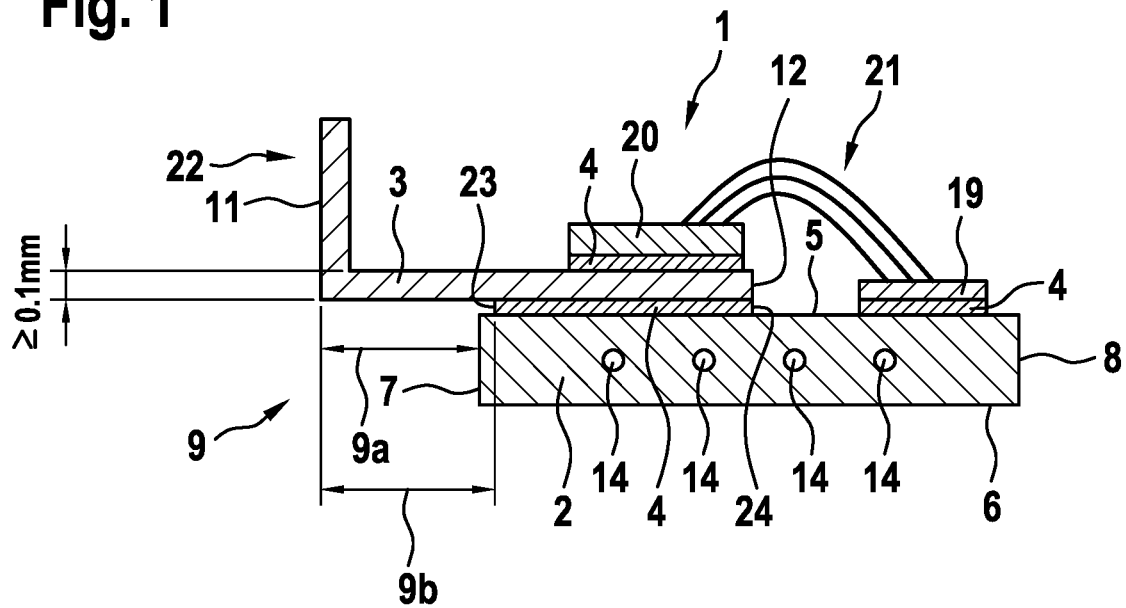

In order that the power is supplied from the outside via the connection means (3) directly to the module and thus the bonding processes that are customary in the prior art are omitted and parasitic inductances on the power supply are avoided, the invention proposes that the connection means (3) protrudes beyond one end (23, 24) of the metallization area (4) at least at one point, is not fixed to the carrier (2) in this area (9) and has contact means (22).

18 Claims, 4 Drawing Sheets

(51) Int. Cl.
*H01L 23/367* (2006.01)
*H01L 23/46* (2006.01)
*H01L 23/15* (2006.01)
*H05K 7/20* (2006.01)
*H01L 23/36* (2006.01)
*H01L 23/00* (2006.01)
*H01L 25/065* (2023.01)
*H01L 25/07* (2006.01)
*H01L 25/18* (2023.01)

(52) U.S. Cl.
CPC .......... *H01L 23/36* (2013.01); *H01L 23/3672* (2013.01); *H01L 23/49811* (2013.01); *H01L 24/32* (2013.01); *H01L 24/48* (2013.01); *H01L 24/73* (2013.01); *H01L 25/0655* (2013.01); *H01L 25/072* (2013.01); *H01L 25/18* (2013.01); *H01L 2224/32225* (2013.01); *H01L 2224/32245* (2013.01); *H01L 2224/48137* (2013.01); *H01L 2224/73265* (2013.01); *H05K 7/20409* (2013.01)

(58) Field of Classification Search
CPC . H01L 23/49838; H01L 23/3735–3736; H01L 23/49811; H01L 23/49861; H01L 23/4867; H01L 23/3672; H01L 23/46; H01L 23/32; H01L 24/48; H01L 24/73; H01L 25/0655; H01L 25/18; H01L 25/072; H01L 2224/32225; H01L 2224/32245; H01L 2224/48137; H01L 2224/73265; H01L 2924/0002
See application file for complete search history.

(56) References Cited

U.S. PATENT DOCUMENTS

| | | | | |
|---|---|---|---|---|
| 2002/0034087 | A1* | 3/2002 | Suzuki | H02M 7/003 363/144 |
| 2004/0164124 | A1* | 8/2004 | Lundstrom | B21J 15/08 228/246 |
| 2008/0153321 | A1* | 6/2008 | Trussel | H01L 25/072 257/E25.016 |
| 2010/0089607 | A1* | 4/2010 | Nakamura | H01L 24/37 174/68.2 |
| 2011/0187003 | A1* | 8/2011 | Oi | H01L 24/48 257/E27.009 |
| 2012/0236504 | A1* | 9/2012 | Wortberg | H01L 25/072 174/252 |
| 2015/0223317 | A1* | 8/2015 | Oi | H01L 23/3735 174/251 |
| 2015/0262926 | A1* | 9/2015 | Ueshima | H01L 23/49582 257/676 |
| 2016/0351468 | A1* | 12/2016 | Liang | H01L 23/3677 |
| 2019/0279943 | A1* | 9/2019 | Soda | H01L 25/07 |
| 2020/0053900 | A1* | 2/2020 | Feurtado | H05K 5/0247 |
| 2020/0234905 | A1* | 7/2020 | Shirakata | H01H 85/38 |

FOREIGN PATENT DOCUMENTS

| | | |
|---|---|---|
| EP | 1174921 A2 | 1/2002 |
| EP | 1703554 A2 | 9/2006 |
| EP | 1936687 A | 6/2008 |
| EP | 2892074 A1 | 7/2015 |
| JP | H09-129797 A | 5/1997 |
| JP | 2011-018933 A | 1/2011 |
| WO | 2007/107601 A2 | 9/2007 |
| WO | 2018/060265 A1 | 4/2018 |

* cited by examiner

MODULE WITH CONNECTION LUGS FOR SUPPLY LINES

CROSS-REFERENCE TO RELATED APPLICATION

This application claims priority from European Patent Application No. EP 20178790.0, filed Jun. 8, 2020, which is hereby incorporated herein by reference in its entirety for all purposes.

The invention relates to a module in the field of power electronics which can control voltages greater than 1,000 V and currents greater than 100 A. The module comprises at least

- an electrically insulating carrier, with at least one connection means, which is connected to the carrier via a metallization area, wherein the connection means is preferably formed from copper and has a material thickness that is greater than 0.3 mm,
- an electronic component which is arranged on the carrier and electrically connected to the connection means in order to control the power supplied and
- a cooling element which is suitable for dissipating heat.

Bipolar transistors with an insulated gate electrode (IGBT) are known which are used as semiconductor components in power electronics. Voltages greater than 1,000 V and currents greater than 100 A are applied to these IGBT modules via supply lines.

The modules known in the prior art comprise a plate-shaped substrate, for example a sintered ceramic, which has a front side and a rear side. A metal cooler is located on the rear side to cool the module. A metallization area consisting of copper with a material thickness between 0.3 mm and 1.0 mm is provided on the front side of the substrate. The connection between the copper and a current and voltage supply outside the module is made by means of so-called bonding wires. A large number of bonding wires are required in order to ensure that the high voltages and currents can be conducted into the module. These bonding wires are partially arranged at a small distance from one another and with a curvature in order to compensate for temperature fluctuations. As a result, so-called parasitic inductances can form. Known methods for connecting the metallization area to the substrate are DCB "direct copper bonded" or AMB "active metal brazing".

The DCB method is a connection technology in which copper can be connected to a ceramic substrate in a high temperature range from 1060 to 1065° C. For this purpose, the copper is heated to near its melting point of 1085° C. The copper reaches the softening temperature range, which influences its properties and dimensional stability in this process step. In the DCB method, cavities, so-called blowholes, can be produced between the ceramic and the copper. These cavities have a detrimental effect on the heat transfer and promote partial discharge, which can be a risk from a safety point of view. The DCB method is used for the metallization of so-called master cards with a size of 7.5"×5.5". A master card can comprise a plurality of substrates with smaller dimensions, which are separated according to their applications. Composites can be produced from copper and ceramics by the DCB method. Depending on the ceramic used, these composites are suitable for 100 to 1,000 load changes.

The AMB method is understood to mean "active metal brazing", i.e. active hard soldering, the connection of metal to ceramics, for example. In this case, copper is connected to ceramic, for example AlSiC, in a vacuum or an inert gas atmosphere by means of a metal solder alloy. The AMB method is a cost-intensive process due to the process conditions, vacuum or inert gas atmosphere. Nevertheless, this method has established itself in the industrial production of cooled power modules, since, depending on the materials used, composites are produced that are suitable for up to 5,000 load changes.

The object of the invention is to improve the performance of a module in power electronics in such a way that, with a high number of load changes, interference-free electronic functionality is ensured over the long term, with a compact form.

According to the invention, this object is achieved by a module having the features of claim 1. A module according to the invention has a carrier, preferably a ceramic carrier, on which a connection means is arranged on a first flat side. This connection means is preferably made of copper and represents the connection to an external current or voltage source. The connection means can be in the form of a line rail or a BUS bar and is connected to the carrier via a metallization area. According to the invention, the connection means extends beyond the geometric dimensions of the metallization area and/or the carrier such that it protrudes beyond the metallization area and/or carrier. In other words, the connection means protrudes beyond the carrier and/or the metallization area at least at one point in the lateral direction. A point can be understood to mean a position and/or an area, for example a side surface, and/or a partial area of a side surface and/or a section/area of the circumference. If the carrier and/or the metallization area has, for example, the shape of a cuboid with the dimensions L×W×H, according to the invention an area or a section of the connection means is arranged outside this cuboid. This means that a first end of the connection means is arranged outside the carrier and/or the metallization area, while a second end of the connection means is arranged in the area of the first flat side of the carrier and/or the metallization area.

The connection means is bonded to the carrier by means of a metallization. In order to ensure a secure connection between the carrier and the connection means, it was surprisingly found that it is sufficient if the connection means is connected to the carrier only in a partial area by means of the metallization. For reliable functionality, it is sufficient if approximately 66% of the base area of the connection means is connected to the carrier by means of the metallization. This means that approximately 33% of the base area of the connection means are arranged outside the carrier, the power module or the metallization area and form an overhang relative to the carrier and/or metallization area. In other words, if the connection means is in the form of a cuboid with L×W×H, the secure connection between the connection means and the carrier is ensured when 66% of the base area of the connection means, which results from L×W, is connected to the carrier. A suitable connection process is AMB. In the area of the overhang, the connection means can rest on the carrier and slide on it during thermal expansion.

At its first end, the connection means has at least one contact element to which the current source or voltage source can be connected. The contact element can be formed as an extension of the connection means and is then arranged in the same plane as the connection means. Soldering or welding processes for fastening the supply lines are carried out thermally away from the carrier. This reduces, and ideally completely prevents, the influence of the power supply fastening process on the module.

In an alternative embodiment, the contact element can be formed at an angle to the connection means. The contact element and connection means then have an L-shape, for example. Other shapes, for example a U-shape, T-shape, etc., are possible, depending on the connection means of the current and voltage supply.

A thermal relief zone in the form of an expansion means can be provided between the first end and the second end of the connection means. The at least one expansion means can be arranged outside the carrier and/or the metallization area, preferably directly adjacent to them. The expansion means compensates for the thermal expansion differences between the connection means and the carrier and/or the heated metallization under the electronic components such as, for example, a chip. As a result, the mechanical load on the power module which occurs due to the heat development is preferably completely prevented.

The expansion means can be an integral part of the connection means and can be designed, for example, in the form of a bent or angled section, a bead, a rounding, a bend, etc. The cross section of the expansion means can be equal to or smaller than the cross section of the connection means.

In a special embodiment, the expansion means can have a cross section which is smaller than the cross section of the connection means. This increases the flexibility of the expansion means. The expansion means can also have one or more cutouts. The cutout can be in the form of an opening with a base or in the form of a through-opening. If the expansion means comprises a plurality of through-openings arranged in a row, it is designed in the form of a perforation.

The shape of the cutout or of the opening can be formed as desired, for example round or square or rectangular or a combination of these shapes. The connection means can include the expansion means before it is connected to the carrier.

Regardless of the shape of the expansion means, this can extend over the entire width or, alternatively, only over a partial area of the width of the connection means. The design of the expansion means is adapted to the heat development during the power feed. It compensates for the expansion of the connection means and thus increases the service life of a module according to the invention.

The fact that the connection means extends laterally or at an angle beyond the metallization area at least at one point, is not fixed on the carrier in this area and has contact elements for a supply line, simplifies the connection of the external power supply to the module. Bonding processes that are complex to produce are no longer required and are omitted. In addition, this avoids parasitic inductances on the power supply. A further advantage of the possibility according to the invention of directly connecting the power feed into the module is the resulting reduced overall height. The bent bonding wires required in the prior art are omitted. Therefore, the overall height of the high-performance circuit is reduced by the dimensions of the bonding wires beyond the electronic components. Miniaturization in power electronics, i.e. a lower overall height, is a constant challenge in the development of components in power electronics.

In one embodiment according to the invention, the connection means protrudes laterally or at an angle over the metallization area at the at least one point and has a contact element which does not protrude over the carrier. This means that, in this embodiment, the connection means is located in the area of the carrier, but is not fixed, for example bonded, to it in a partial area. However, it can rest on the carrier and can slide thereon during thermal expansion. This special embodiment is suitable for applications in which only a little space is available to the side adjacent to the carrier.

In an alternative embodiment, the connection means can protrude over the metallization area on all sides that delimit the connection means, that is to say over the entire circumference, and nevertheless can be arranged within the dimensions of the carrier.

The term "electronic component" comprises all active and passive electrical or electronic structural elements or structural parts and/or parts of structural elements or structural parts, such as, for example, conductive tracks, bonding wires, voltage sources, switches, resistors, capacitors, coils, diodes, actuators, sensors, ICs (integrated circuits), chips, SiC chips, transistors, etc. This list of electronic components should make it clear that in the context of this document all available electrical or electronic structural parts should be considered as electronic components. The list has no claim to completeness.

The electronic component has contact points in the form of metallization areas, by means of which a connection to, for example, the connection means and/or a further electrical component, as defined above, is possible. These contact points are part of the electronic component, are metallically and electrically conductive and enable a functional installation of the electronic component in an electrical circuit. In a preferred embodiment, the contact points, i.e. the metallization areas, can be designed as a coating of Ag, Au, Sn and/or SAC solder. In this way it is possible to ensure a bonded electrically conductive connection to a further component of the electrical circuit.

The connection means preferably consists of copper. In one embodiment at least one electrically conductive coating, i.e. a contact point or a metallization area, is applied to the connection means. The metallization area, i.e. the contact point, is a constituent of the connection means and is bonded thereto. The coating is preferably selected from among Ag, Au, Sn and/or SAC solders.

In a preferred embodiment the connection means is made of copper having a purity of ≥99%, preferably ≥99.9% and particularly preferably ≥99.99%. In a particularly preferred embodiment copper with a low oxygen content or low phosphorus content is used for the connection means.

According to the invention, at least one electronic component is applied directly to the connection means, that is to say the contact points of this electronic component are in direct bonded electrical connection to the contact point of the connection means. In this case the metal and/or the material of the coating, i.e. the contact point of the connection means, reacts during connection of the electronic component to the metal and/or the material of the coating of the contact point of the electronic component. This produces a bonded mechanical and/or electrical connection. There are no joining means, such as, for example, bonding wires, between these electronic components and the connection means. In this context, "directly connected" means that two parts, for example an electronic component and a connection means, are arranged directly touching each other when they are operatively connected. No additional means are necessary for electrical connection. Due to the absence of additional means, savings can be made not only in terms of these means but additionally in terms of the processes, such as, for example, soldering, welding, etc., which are necessary for connecting these means. The absence of the additional means and processes reduces the transitions between two components which cause the power losses, for example inductances. The efficiency and the service life of such an arrangement is increased, and the manufacturing costs and product costs are reduced.

By the direct connection between the connection means and the electronic component, these parts of an electrical circuit can be arranged in a plane, vertical displacements of the individual parts relative to each other are avoided or minimized. A displacement of the electrical component relative to the connection means and the electrical connection thereof via bonding wires or other wired connections frequently lead to electronic signal disruptions, which create power losses and should therefore be avoided. An arrangement according to the invention avoids these disadvantages.

For protection against external influences, the modules according to the invention can be encapsulated with an electrically non-conductive compound (for example silicone compounds, as known in the prior art), with the exception of the contact means leading to the outside.

A fastening method known per se is selected according to the application of a module. For example, the external power source is electrically connected to the contact element via fastenings such as soldering, clamping, crimping, screwing. Plug connections can also be used.

The electrically insulating carrier is preferably a sintered ceramic. Aluminum oxide or aluminum nitride ceramics are very suitable in order to produce a high-quality power module with a long service life. They are characterized by their excellent thermal conductivity in connection with the electrically insulating property.

The carrier preferably has cooling means to cool the module. These can be arranged on the second flat side of the carrier, for example, in the form of fins for air cooling. In order to optimize the thermal coupling of the fins to the carrier, the fins are preferably connected integrally to the carrier. In other words, the cooling means and the carrier form one part and are produced together. There is no dividing line between the cooling means and the carrier.

The carrier can also have at least one cavity in the form of a channel. This channel then forms the cooling means through which fluids (gas, water, air, etc.) flow, whereby the module can be cooled. It is then a fluid cooling means or a fluid-cooled module.

The connection means is preferably connected to the ceramic carrier via the AMB process. The AMB process in particular makes it possible to connect a ceramic carrier to a connection means protruding or projecting from the metallization area and/or carrier with a material thickness greater than 0.3 mm and/or a relief zone. In this case, copper is connected to ceramic, for example AlSiC, in a vacuum or an inert gas atmosphere by means of a metal solder alloy, i.e. an active solder. In the AMB method, preference is given to working with a solder paste that is printed between 20-40 µm and thus a surface can be uniformly wetted. It has been found that if the AMB method is used carefully, no blowholes or cavities form between the ceramic and the connection means. As a result, a secure and reliable connection is produced between the ceramic and the connection means. The cavity-free connection between the connection means and the ceramic favors the heat transfer and thus the heat dissipation by means of the cooling means. This greatly improves the cooling performance.

The connections of the electronic components, for example the Si/SiC chips within the module, to the connection means can be made by means of so-called "ribbon bonding".

A method according to the invention for producing a module according to the invention is described by the features of method claim 13. It relates to modules to which voltages greater than 1,000 V and currents greater than 100 A are applied via supply lines. An electrically insulating carrier is connected via a metallization area to a connection means with a material thickness greater than 0.3 mm. Because the connection means extends laterally or at an angle at least beyond the metallization area and/or the carrier at least at one point, and has at least one contact element, bonding processes are no longer required for the power supply from the outside to the module. This avoids parasitic inductances. In addition, the overall height of the high-performance circuit can be reduced or decreased. The arcuate extension of the bonding wires beyond the electronic components is no longer necessary. The connection means is connected to the power supply by means of a contact element.

A sintered ceramic is preferably used as the electrically insulating carrier and the connection means is fixed on the metallization area of the carrier using an AMB process. The advantages of the AMB method have already been described in detail in the description of the high-performance circuit modules according to the invention.

The invention relates to an electronic high-performance module or the modules thereof, in which voltages greater than 1,000 V and currents greater than 100 A are applied via supply lines, with an electrically insulating carrier on which a connection means with a material thickness greater than 0.3 mm is fixed via a metallization area and on which electronic components are arranged which are electrically connected to the connection means as required.

In order that the power is supplied from the outside directly to the module and to the connection means and thus the bonding processes that are customary in the prior art are omitted and parasitic inductances on the power supply are avoided, the invention proposes that the connection means extends laterally or at an angle at least beyond the metallization area at least at one point, is not fixed on the carrier in this overhang and has contact means for the supply lines.

The invention will be explained with reference to figures. All figures contain partial, schematic representations of the invention and are used by way of example to explain the invention. Special embodiments of the invention can deviate from these figures. The representation of the power module according to the invention in the figures is sketchy and schematic.

In the figures

Figure 2:
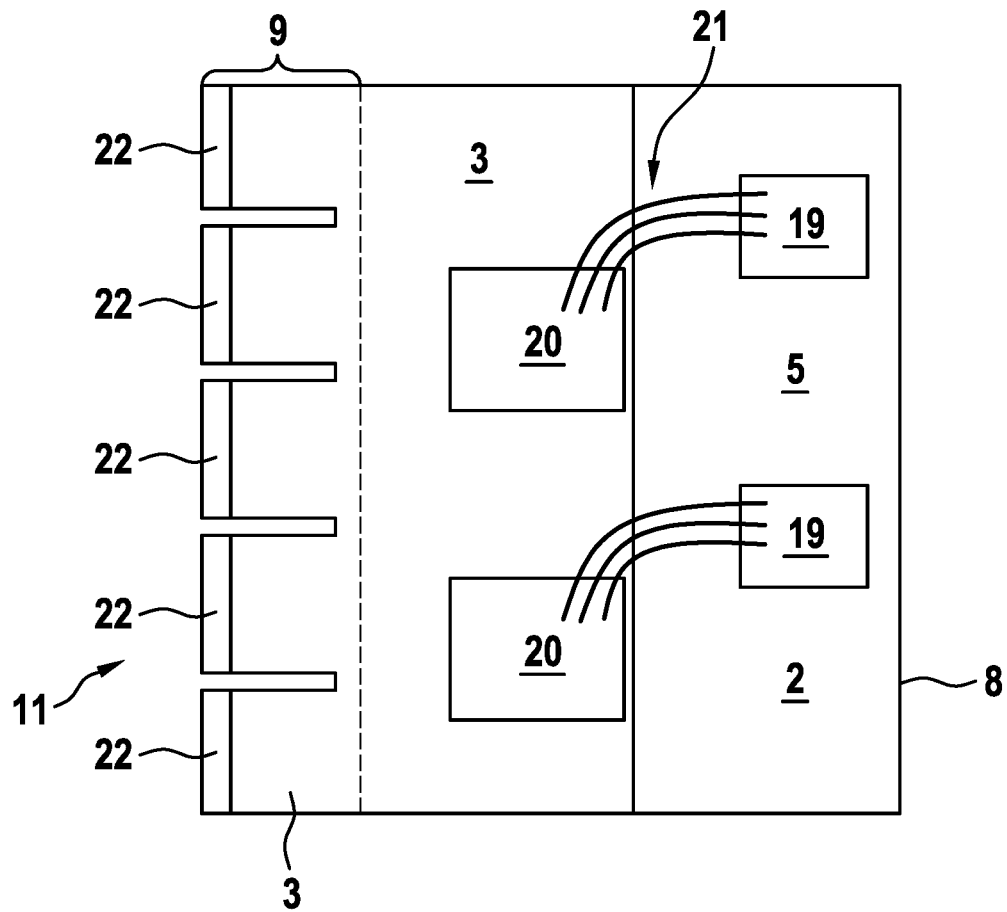
Figure 3:
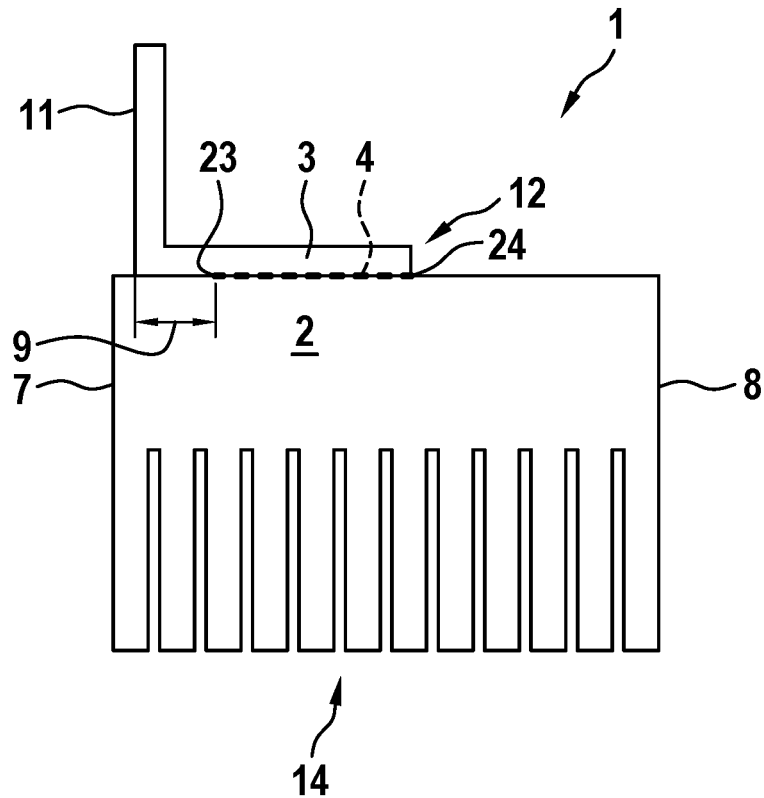
Figure 4:
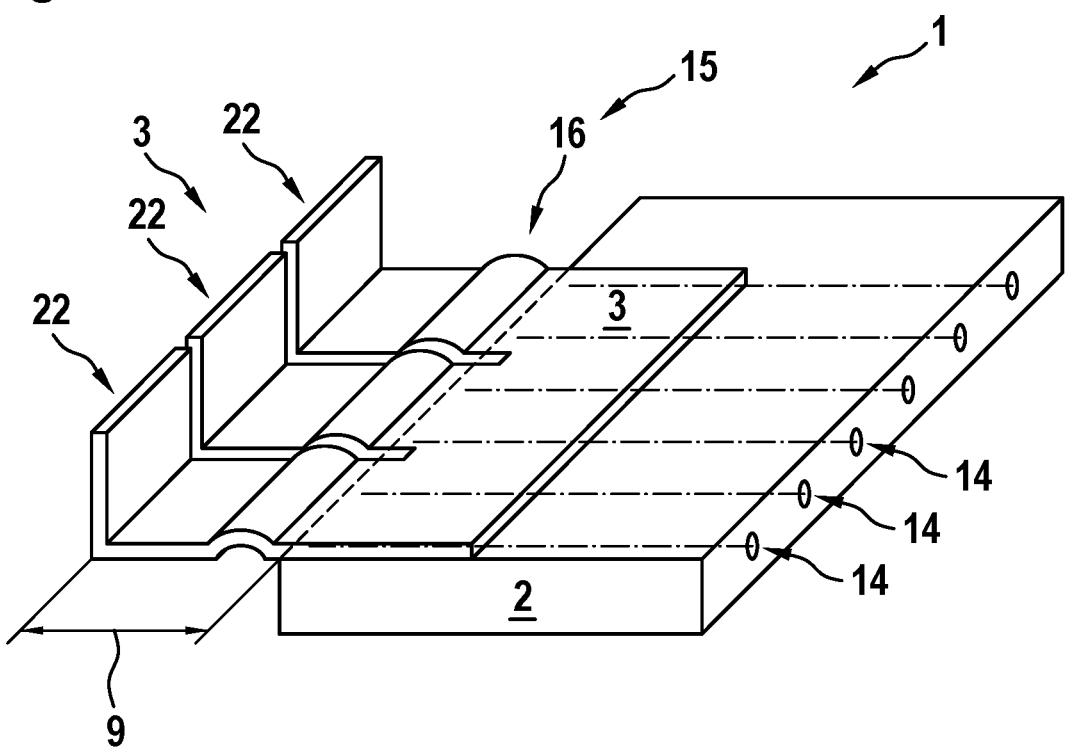
Figure 5A:
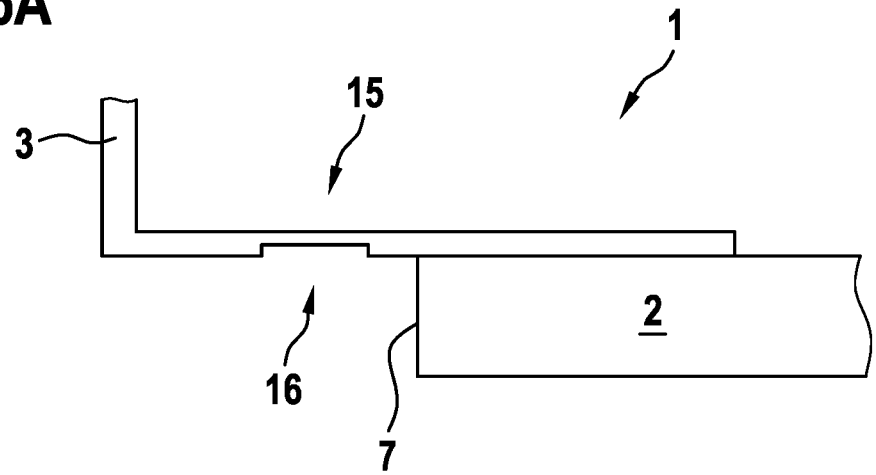
Figure 5B:
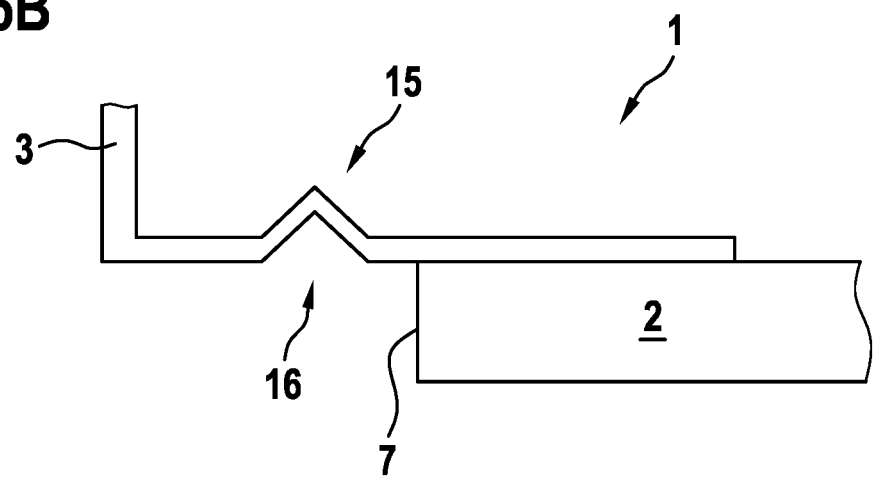
Figure 5C:
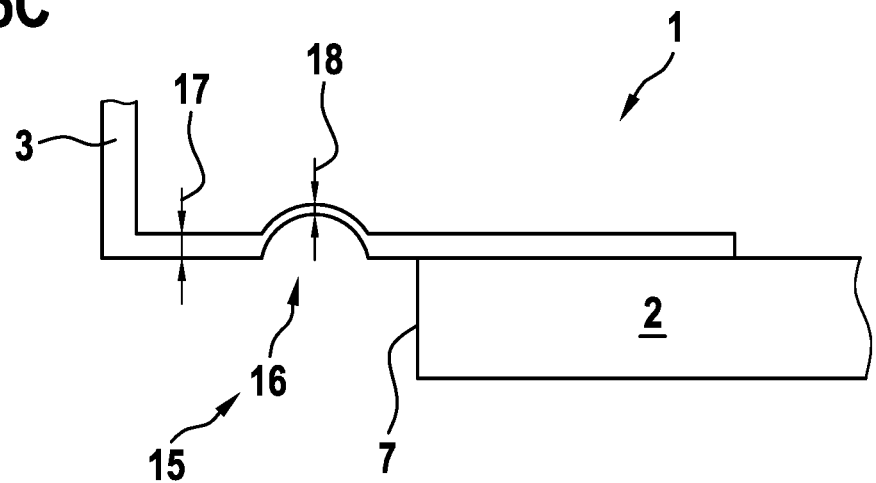
Figure 6:
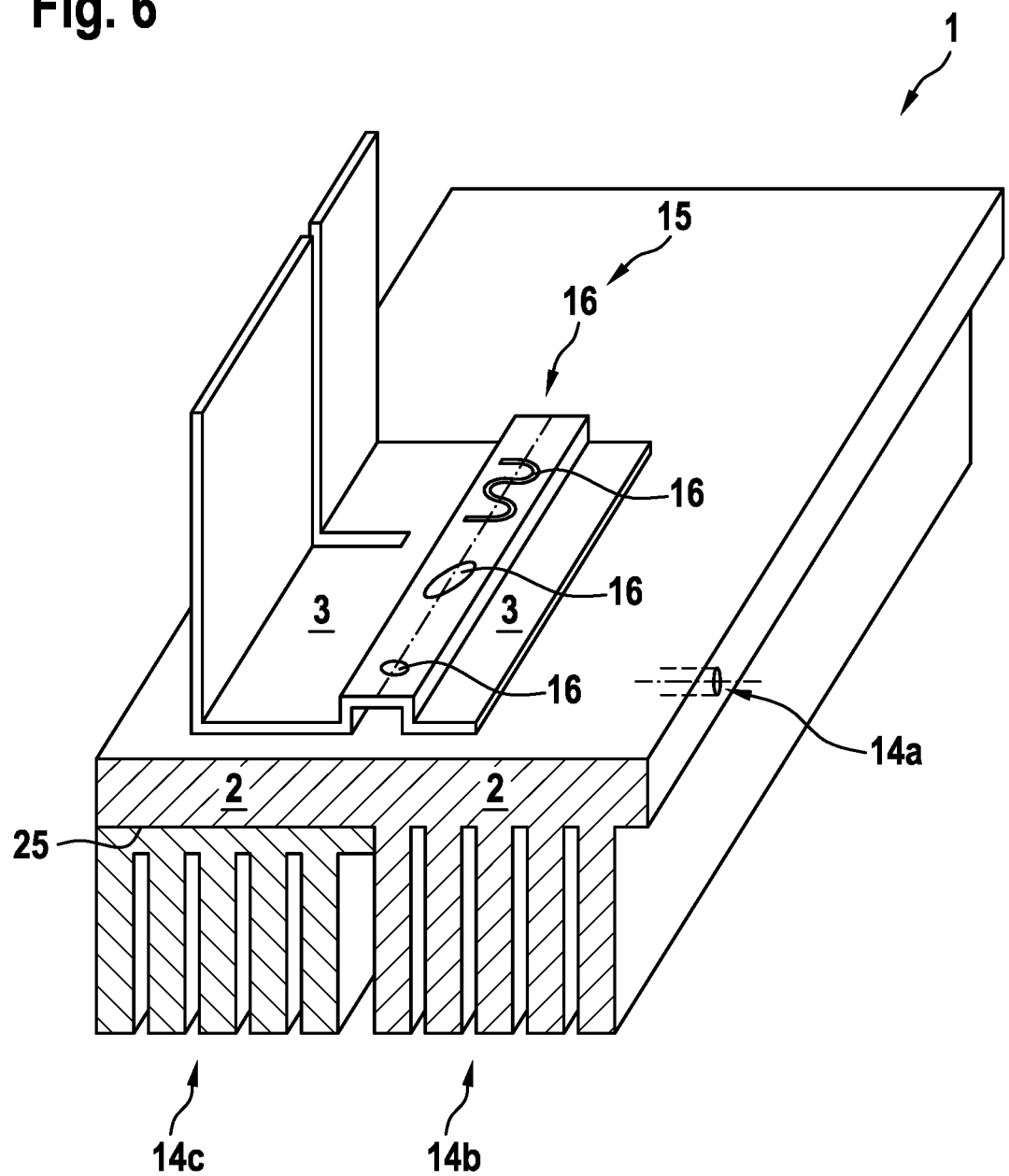

FIG. 1: is a cross section of a power module according to the invention,

FIG. 2 is the top view of a power module according to FIG. 1,

FIG. 3 shows a special embodiment of a power module according to the invention, FIG. 4 is a perspective view of a power module according to the invention with a thermal relief zone, FIG. 5*a*, 5*b*, 5*c* show different embodiments of a thermal relief zone of a power module according to FIG. 4, and FIG. 6 is a perspective view of a performance mode according to the invention with different characteristics of the thermal relief zone and with different cooling means.

FIG. 1 shows a power module according to the invention, a module 1 with a carrier 2, a connection means 3, with a height or material thickness >=0.3 mm, which is connected to the carrier 2 via a metallization area 4. According to FIG. 1, the carrier 2 is a plate measuring 7.5 inches*5.5 inches. These ceramic plates are also known as substrates. A first electronic component 19, for example a chip, is in turn connected to the carrier 2 via a metallization area 4. This first electronic component 19 is connected to a second component 20 by means of so-called bonding wires 21. The second component 20 is arranged directly on the connection means 3 via a metallization area. In this embodiment the metallization area 4 shown with the reference numeral 4 comprises contact points in the form of a coating. Some of these contact points are part of the connection means 3 and others of these contact points are part of the second component 20. This leads to the component 20 being bonded directly, without additional means (bonding wires 21), to the connection means 3. The carrier 2 according to FIG. 1 is a ceramic carrier 2 in the form of a cuboid. The cuboid is delimited by a first flat side 5 and a second flat side 6. The distance between these two flat sides 5 and 6 forms the height of the ceramic carrier 2. In a lateral orientation, the carrier 2 is delimited by four side surfaces. The first side surface 7 and the second side surface 8 can be seen in FIG. 1. The connection means 3 is delimited by a first end 11 and a second end 12. The second end 12 of the connection means 3 is arranged within an area which is formed by the side surfaces of the carrier 2. The first end 11 of the connection means 3 is arranged at a distance from the carrier 2 and from the metallization area 4 which has a first end 23 and a second end 24. The distance can be seen as the overhang 9 in FIG. 1. The overhang 9a is formed by the distance between the first end 11 of the connection means 3 and the first side surface 7 of the carrier 2. The overhang 9b is the distance between the first end 11 of the connection means 3 and the first end 23 of the metallization area 4. A contact means 22 is provided at the first end 11 of the connection means 3. This contact means 22 is connected to a power supply (not shown). As a result, the power module can be supplied with current and voltage. So that the power module 1 can be cooled sufficiently, it has cooling channels 14. Fluids can be passed through these cooling channels 14 in order to enable and improve the heat dissipation.

FIG. 2 shows the top view of the first flat side 5 of the module 1 according to the invention according to FIG. 1. The connection means 3, which is connected to the carrier 2 via the metallization area 4, has five contact means 22. A distance, i.e. a gap, is provided between the individual contact means 22. The distance is so great that when a voltage is applied, no flashover can take place between two adjacent contact means 22. The number of contact means 22 as well as their size and design is dependent on the power consumption of the module 1 and can be adapted to this. The area in which the connecting means 3 protrudes beyond the carrier 2 is shown by the overhang 9. In addition, FIG. 2 shows, by way of example, first and second electronic components 19, 20. The connection between the electronic components 19, 20 is indicated by bonding wires 21. For the sake of clarity, only two bonding wires 21 are indicated in each case. In fact, a plurality of these bonding wires 21 are used for the connection between the electronic components. The second component 20 is connected directly to the connection means. No bonding wires 21 are required for connecting the second component 20 to the connection means 3.

FIG. 3 shows a special embodiment of a module 1 according to the invention. Both the first end 11 and the second end 12 of the connection means 3 are located within the area which is formed by the side surfaces of the carrier 2. The metallization area 4 is delimited by a first end 23 and a second end 24. The surface area of the connection means 3 which is arranged in the direction of the carrier 2 is larger than the surface area of the metallization area 4 via which the connection means 3 is connected to the carrier 2. The overhang 9 is formed by the distance between the first end 11 of the connection means 3 and the first end 23 of the metallization area 4. The ceramic carrier 2 comprises cooling means 14 in the form of fins. These cooling means 14 are an integral part of the carrier 2 and are integrally connected to it. There is no dividing line between the cooling means 14 and the carrier 2. The cooling means 14 are individual fins which are arranged at a distance from one another. This creates spaces through which air can circulate, thereby increasing the cooling performance.

FIG. 4 shows a module 1 according to the invention, wherein the connection means 3 has a relief zone 15 with expansion means 16 in the area of the overhang 9. This relief zone 15 is designed in such a way that it compensates for expansions that occur due to the power input into the module and the associated heat development. This increases the service life of the module 1. The relief zone 15 according to FIG. 4 consists of round-shaped sections which include the expansion means 16. The expansion means 16 are designed to be flexible. The flexibility can be achieved in that the cross section of these sections is reduced compared to the cross section of the connection means 3. In addition, cooling means 14 in the form of cooling channels can be seen from FIG. 4. These cooling means 14 are indicated in FIG. 4 by way of example. Depending on the application of the module 1, the cooling means can vary in their arrangement, orientation, diameter, size and their course.

Expansion means 16 of the relief zone 15 which have different shapes can be seen in FIGS. 5A, 5B and 5C. As FIG. 5A shows, this is a cutout or, according to FIG. 5B, an angled flexible zone which is in the form of a triangle or, according to FIG. 5C, in the form of a bent section. In order to increase their flexibility, the expansion means 16 can have smaller cross sections than the connection means 3, regardless of their shape. In FIG. 5C it can be seen that the height 18 or material thickness of the expansion means 16 is less than the height 17 or material thickness of the connection means 3. All of these differently shaped expansion means 16 have the feature in common that they are designed to be flexible. The flexibility can be formed by the geometric shape or by the for example, tapered cross section.

FIG. 6 shows a perspective illustration of a module 1 according to the invention. In this case, different cooling means 14a, 14b, 14c are arranged on the carrier 2. It has a cooling means 14a in the form of a cooling channel, as also shown in FIG. 4. In addition, the carrier 2 has a cooling means 14b, as shown in FIG. 3. This cooling means is integrally connected to the carrier 2. In addition, it can be seen from FIG. 6 that a cooling means 14c is connected to the carrier 2. The cooling means 14c is an independent means which is connected to the carrier 2 using a connection technology known per se. Therefore, a dividing line 25 can be seen between the cooling means 14c and the carrier 2. The various cooling means 14a, 14b, 14c shown in FIG. 6 can be arranged individually on a carrier 2 or in any combination imaginable.

In addition, the relief zone 15 can be seen from FIG. 6. This relief zone 15 has differently designed expansion means 16. These are cutouts within the relief zone 15, which increases its flexibility. The cutouts can be formed by bores, blind bores or recesses with any shape, for example elliptical recesses or freely shaped recesses. Any combination of recesses within the relief zone 15 which increases the flexibility of this relief zone 15 is conceivable.

None of the figures shows that the electronic high-performance circuit can be encapsulated with a non-conductive potting compound. If this is the case, only the contact means 22 protrude from the potting compound and can be connected to an external power supply.

| | |
|---|---|
| 1 | module |
| 2 | carrier |
| 3 | connection means |
| 4 | metallization area |
| 5 | first flat side of 2 |
| 6 | second flat side of 2 |
| 7 | first side surface of 2 |
| 8 | second side surface of 2 |
| 9, 9a, 9b | overhang |
| 11 | first end of 3 |
| 12 | second end of 3 |
| 14, 14a, 14b, | cooling means |
| 15 | relief zone |
| 16 | expansion means |
| 17 | height of 3 |
| 18 | height of 16 |
| 19 | first electronic component |
| 20 | second electronic component |
| 21 | bonding wire |
| 22 | contact means |
| 23 | first end of 4 |
| 24 | second end of 4 |
| 25 | dividing line |

The invention claimed is:

1. A module in which voltages greater than 1,000 V and currents greater than 100 A can be applied via supply lines, comprising:
an electrically insulating carrier,
a connection means which has a material thickness greater than 0.3 mm and is connected to the carrier via a first metallization area which is delimited by a first end and a second end,
electronic components electrically connected to the connection means,
at least one electronic component connected via a second metallization area to the connection means and
a cooling means,
wherein a surface area of the connection means over and facing the carrier is larger than a surface area of the first metallization area connecting the connection means to the carrier such that at least a portion of the connection means over and facing the carrier protrudes at least at one point beyond one end of the first metallization area, and wherein the portion of the connection means over and facing the carrier that protrudes at least at one point beyond one end of the first metallization area is not fixed to the carrier but rests on the carrier and can slide on the carrier during thermal expansion.

2. The module according to claim 1, wherein the connection means and the at least one electronic component are arranged on a first flat side of the carrier and the cooling means is arranged on top of a second flat side of the carrier.

3. The module according to claim 1, wherein the carrier is delimited by side surfaces and the connection means projects beyond at least one side surface of the carrier.

4. The module according to claim 1, wherein the connection means has at least one thermal relief zone.

5. The module according to claim 4, wherein the at least one thermal relief zone is arranged outside the carrier, preferably directly adjacent to it.

6. The module according to claim 4, wherein the at least one thermal relief zone has expansion means.

7. The module according to claim 6, wherein a cross section of the expansion means is smaller than the cross section of the connection means.

8. The module according to claim 6, wherein the expansion means are formed by openings or material recesses.

9. The module according to claim 1, wherein the electrically insulating carrier is a sintered ceramic.

10. The module according to claim 1, wherein the cooling means of the carrier are formed by fins.

11. The module according to claim 10, wherein the cooling means designed as fins are connected integrally to the carrier without a dividing line.

12. The module according to claim 1, wherein the cooling means of the carrier are formed by cavities.

13. The module according to claim 1, wherein the connection means is bonded to the carrier via an active metal brazing process.

14. The module according to claim 1, wherein the connection means comprises copper.

15. A method for producing an electronic high-performance module, which can be supplied with voltages greater than 1,000 V and currents greater than 100 A via supply lines, comprising connecting a connection means with a thickness greater than 0.3 mm to an electrically insulating ceramic carrier by means of a first metallization area, arranging electronic components on the carrier and electrically connecting the electronic components to the connection means, and electrically connecting at least one electronic component via a second metallization area to the carrier, wherein a surface area of the connection means over and facing the carrier is larger than a surface area of the first metallization area connecting the connection means to the carrier such that at least a portion of the connection means over and facing the carrier protrudes at least at one point beyond one end of the first metallization area, and wherein the portion of the connection means over and facing the carrier that protrudes at least at one point beyond one end of the first metallization area is not fixed to the carrier but rests on the carrier and can slide on the carrier during thermal expansion.

16. The method according to claim 15, wherein the electrically insulating carrier is a sintered ceramic and wherein connecting the connection means to the electrically insulating ceramic carrier by means of the first metallization area is accomplished with active metal brazing.

17. The method according to claim 16, wherein the active solder used is a solder paste which is printed as a plate with a thickness between 20-40 µm.

18. The method according to claim 15, wherein the connection means comprises copper.

* * * * *